United States Patent
Fan

(10) Patent No.: US 8,299,587 B2
(45) Date of Patent: Oct. 30, 2012

(54) LEAD FRAME PACKAGE STRUCTURE FOR SIDE-BY-SIDE DISPOSED CHIPS

(75) Inventor: Wen-Jeng Fan, Hsinchu (TW)

(73) Assignee: Powertech Technology Inc., Hukou, Hsinchu (TW)

( * ) Notice: Subject to any disclaimer, the term of this patent is extended or adjusted under 35 U.S.C. 154(b) by 283 days.

(21) Appl. No.: 12/764,596

(22) Filed: Apr. 21, 2010

(65) Prior Publication Data

US 2011/0260306 A1    Oct. 27, 2011

(51) Int. Cl.
*H01L 23/495* (2006.01)

(52) U.S. Cl. .......... 257/676; 257/E23.037; 257/E23.052

(58) Field of Classification Search .................. 257/676, 257/E23.037, E23.052

See application file for complete search history.

(56) References Cited

U.S. PATENT DOCUMENTS

| 6,574,107 B2 * | 6/2003 | Jeon et al. ............... 361/709 |
| 7,633,143 B1 * | 12/2009 | Fan ............... 257/676 |
| 7,714,455 B2 * | 5/2010 | Son et al. ............... 257/787 |
| 2010/0193920 A1 * | 8/2010 | Poh et al. ............... 257/676 |

* cited by examiner

*Primary Examiner* — Matthew E Warren
(74) *Attorney, Agent, or Firm* — Muncy, Geissler, Olds & Lowe, PLLC

(57) ABSTRACT

A lead frame package structure for side-by-side disposed chips including a lead frame, at least two chips, and a package material. The lead frame includes a plurality of inner leads; a plurality of outer leads; and at least two chip carrying areas having different horizontal levels. The chips are of different sizes and are respectively disposed on the chip carrying areas. The package material encapsulate the inner leads, the chip carrying areas and the chips, wherein the outer leads exposed out of the package material extend from the inner leads and have different horizontal levels.

8 Claims, 4 Drawing Sheets

LEAD FRAME PACKAGE STRUCTURE FOR SIDE-BY-SIDE DISPOSED CHIPS

BACKGROUND OF THE INVENTION

1. Field of the Invention

The present invention is related to a semiconductor packaging technology, and more particularly to a lead frame package structure for side-by-side disposed chips.

2. Description of the Prior Art

In semiconductor packaging processes, lead frames are widely used for carrying chips, conductive media, etc. In a general multi-chip package, chips may be stacked or side-by-side disposed. Because of the limitation of the standard height of a package, side-by-side disposition of chips is more suitable.

However, when the chips have non-uniform sizes or different thicknesses, non-uniform gaps for the mold flow due to asymmetrical structure during injection molding may easily cause air bubbles or air bubbles to be encapsulated by back flow, affecting the appearance and the yield of the package. Therefore, it is highly desirable to balance the mold flow during injection molding for packaging chips of different sizes.

SUMMARY OF THE INVENTION

The present invention is directed to a lead frame package structure for side-by-side disposed chips. The lead frame has chip carrying areas of different horizontal levels to accommodate chips of different sizes while effectively maintaining the mold flow to be balanced during injection molding, thereby preventing warpage of the package.

The present invention is directed to a lead frame package structure for side-by-side disposed chips. Through a down set stamping process, the lead frame can have chip carrying areas having different horizontal levels. The present invention reduces the number of times the down set stamping process is performed, so as to have a better coplanarity control of the lead frame and to increase the yield and throughput.

According to an embodiment of the present invention, the lead frame package structure for side-by-side disposed chips includes a lead frame, at least two chips and a package material. The lead frame includes a plurality of inner leads, a plurality of outer leads, and at least two chip carrying areas having different horizontal levels. The chips are of different sizes and are respectively disposed on the chip carrying areas. The package material encapsulates the inner leads, the chip carrying areas and the chips, wherein the outer leads exposed out of the package material are extended from the inner leads and have different horizontal levels.

The objectives, technologies, features and advantages of the present invention will become apparent from the following description in conjunction with the accompanying drawings wherein certain embodiments of the present invention are set forth, by way of illustration and example.

DESCRIPTION OF THE PREFERRED EMBODIMENT

The detailed description of the present invention is presented as follows. The described preferred embodiments are presented for the purpose of illustration, and are not intended to limit the scope of the present invention.

Figure 1A:
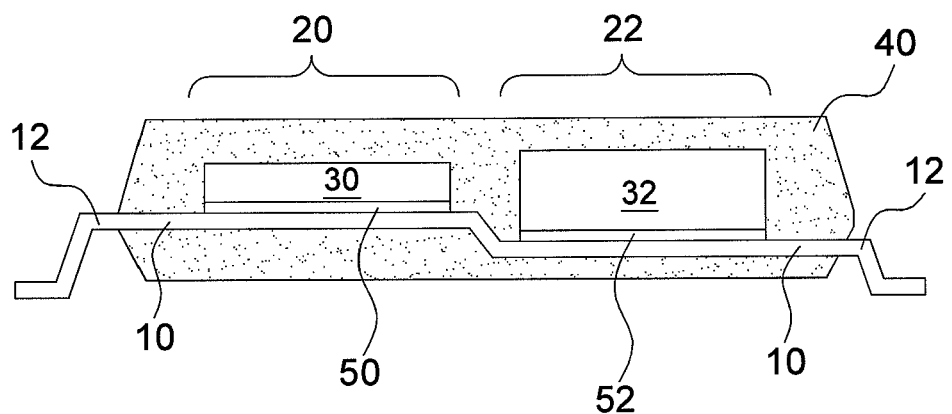
FIG. 1A and FIG. 1B are schematic diagrams illustrating one embodiment of the present invention.

FIG. 1A is a schematic diagram illustrating the lead frame package structure for side-by-side disposed chips according to one embodiment of the present invention. Referring to FIG. 1A, the lead frame package structure according to the present embodiment includes: a lead frame; at least two chips 30, 32; and a package material 40. The chips 30, 32 are respectively disposed on chip carrying areas 20, 22 of the lead frame. The package material 40 encapsulates the chip carrying areas 20, 22, and the chips 30, 32, and exposes only the outer leads 12 of the lead frame.

Figure 1B:
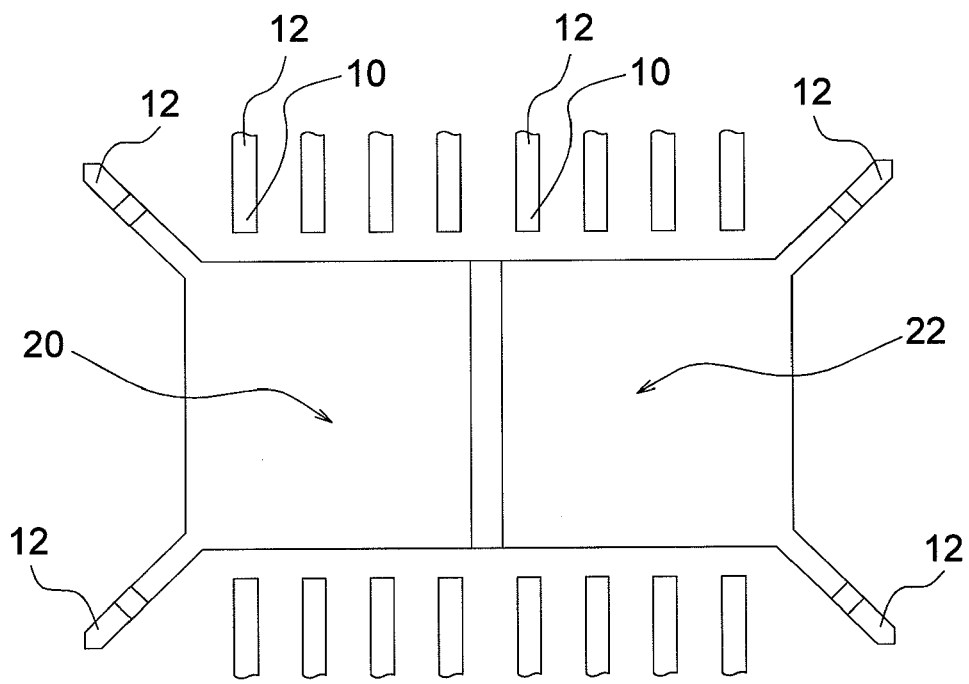

FIG. 1B is a top-view diagram schematically illustrating the lead frame of the present embodiment shown in FIG. 1A. Referring to FIG. 1B, the lead frame according to the present embodiment includes a plurality of inner leads 10, a plurality of outer leads 12 and at least two chip carrying areas 20, 22 having different horizontal levels. As shown in FIG. 1A and FIG. 1B, the horizontal levels of chip carrying areas 20, 22 have different heights, and the lower chip carrying area 22 has a larger chip accommodating space, so that when the chips 30, 32 of different sizes are disposed on the chip carrying areas 20, 22 of the lead frame, the thicker chip 32 is disposed on the lower chip carrying area 22.

In the aforementioned embodiment, the package material 40 encapsulates the inner leads 10, the chip carrying areas 20, 22 and the chips 30, 32. The outer leads 12 exposed outside the package material 40 are extended from the inner leads and are respectively correspond to the chip carrying areas 20, 22 and therefore have different horizontal levels.

According to the present embodiment as shown in FIG. 1A and FIG. 1B, the chip carrying areas 20, 22 are die pads of the lead frame. In the present embodiment, the required structure having the chip carrying areas 20, 22 arranged at horizontal levels of different heights may be obtained through performing the stamping process once. Besides, the chips 30, 32 are adhered to the chip carrying areas 20, 22 through the adhesive layers 50, 52.

Figure 2:
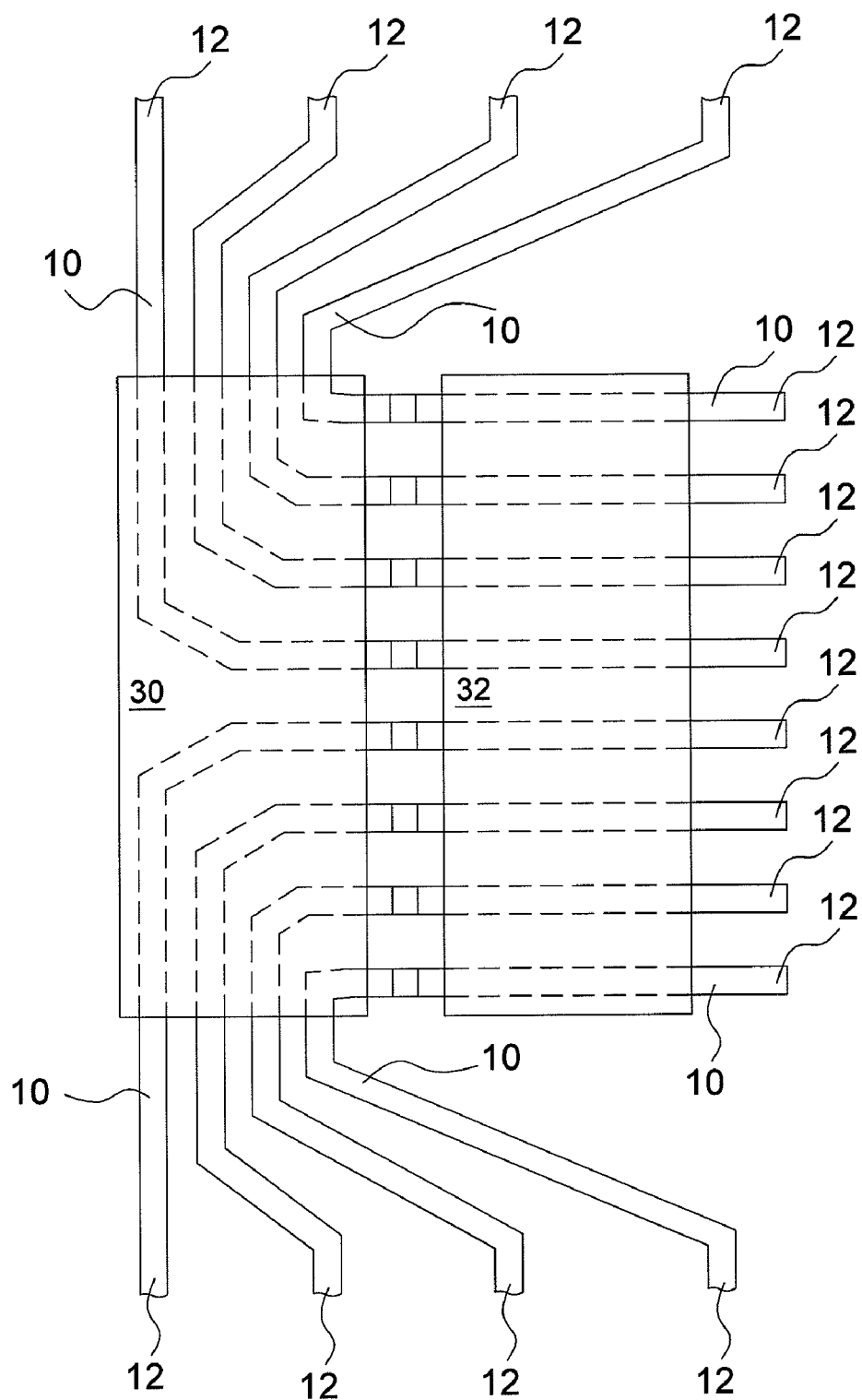
FIG. 2 is a schematic diagram illustrating one embodiment of the present invention.
Figure 3A:
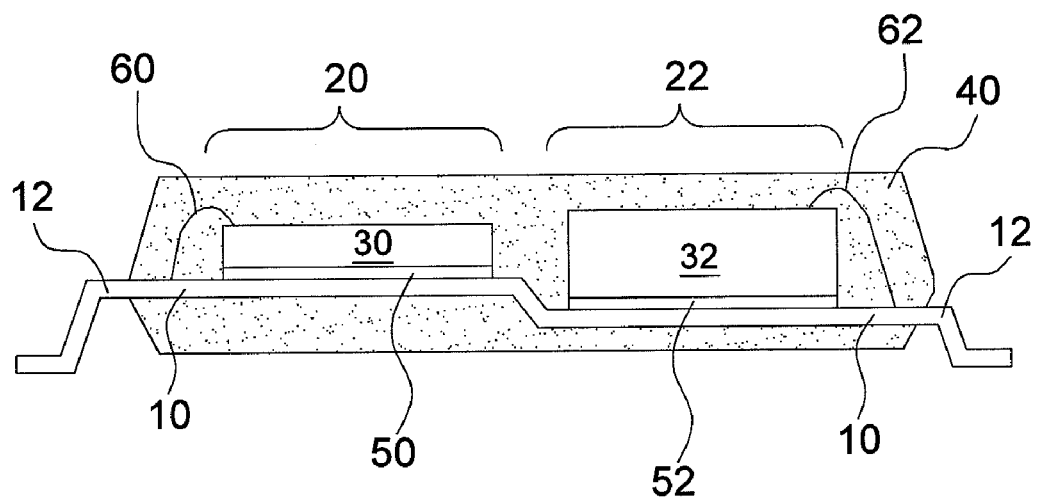
FIG. 3A, FIG. 3B and FIG. 3C are schematic diagrams illustrating different embodiments of the present invention.

FIG. 2 is a top-view diagram schematically illustrating the lead frame and the disposed chips according to an embodiment of the present invention. As illustrated in FIG. 2, in the present embodiment, the chip carrying areas 20, 22 (in reference to FIG. 3A) may be constructed with a plurality of the inner leads 10 of the lead frame. The chips 30, 32 are adhered to the chip carrying areas 20, 22 through the adhesive layers 50, 52 (in reference to FIG. 3A). The chips 30, 32 are disposed on different chip carrying areas 20, 22 according to the respective thickness. The thicker chip 32 is disposed on the chip carrying area 22 which is down set at a lower horizontal level. According to the present embodiment, the chips 30, 32 are electrically connected to the inner leads 10 of the lead frame through bond wires 60, 62.

As illustrated in FIG. 1A and FIG. 1B, the chips 30, 32 are adhered to chip carrying areas 20, 22 of the die pad of the lead frame through the adhesive layers 50, 52. It can be understood that the chips 30, 32 can be connected to the inner leads 10 of the lead frame through bond wires, too (not illustrated in the figure).

Figure 3B:
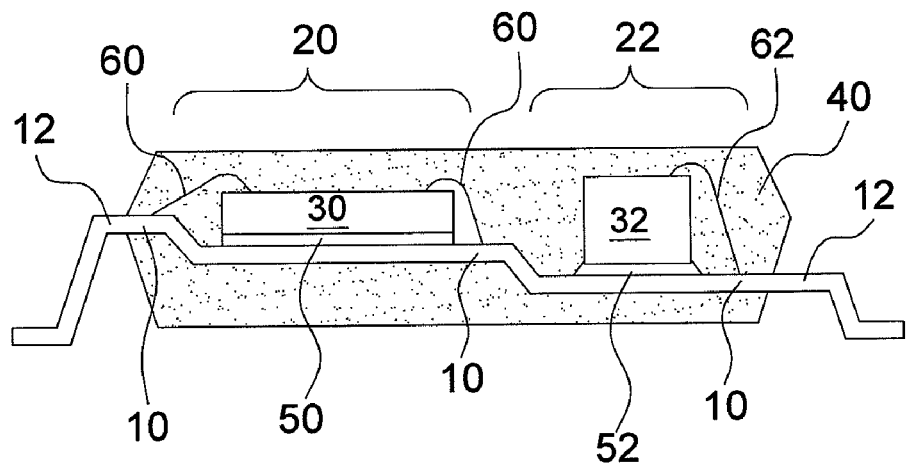

Referring to FIG. 3B, according to an embodiment, the chip carrying areas 20, 22 of different horizontal levels may also have two down set levels. The thicker chip 32 of the chips 30, 32 is disposed on the chip carrying area 22 down set at the lower level. In such manner, the size of the chip is allowed to have more variations, and the tolerance of a package to accommodate chips of different sizes is increased.

Referring still to FIG. 3B, according to the present embodiment, the outer leads 12 exposed out of the package material 40 may extend the horizontal level of the inner leads 10 such as the outer lead 12 corresponding to and having the same horizontal position as the chip carrying area 22. However, the present invention is not limited to be embodied as such. The outer leads 12 exposed out of the package material 40 may not have to extend the horizontal level of the inner leads 10 such as the outer lead 12 corresponding to and yet having a different horizontal position as the chip carrying area 20.

Figure 3C:
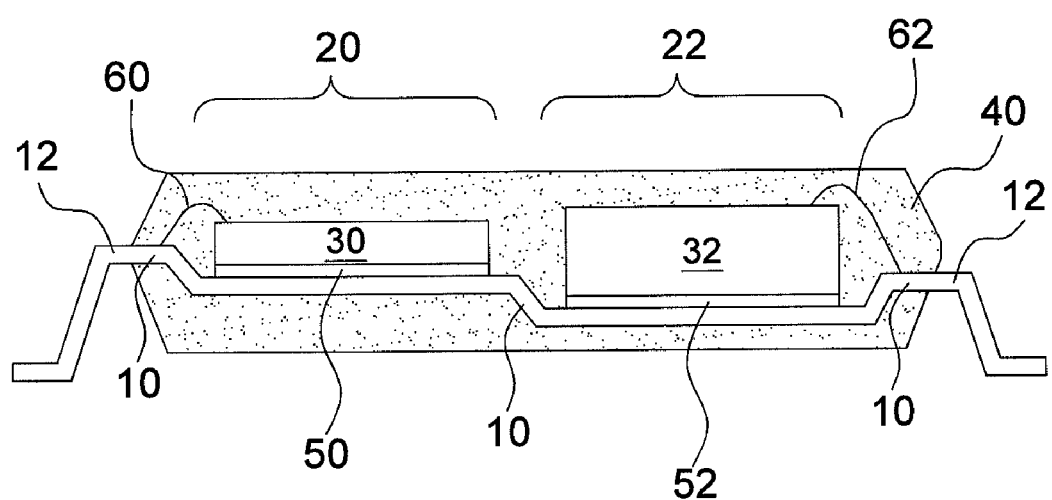

Referring to FIG. 3C, according to an embodiment, the chip carrying area of the lead frame such as the chip carrying area 22 may be designed to have a cup structure. As such, even in the case of adhesive overflow from the adhesive layer 52 for adhering the chip 32, the wire bonding areas of the inner leads 10 for electrical connections may not be contaminated.

Based on above description, the lead frame package structure for side-by-side disposed chips of the present invention is characterized to provide a lead frame with chip carrying areas having different horizontal levels. Particularly, the outer leads are in correspondence to the chip carrying areas and also have different horizontal levels. By avoiding stamping multiple times at the same position during the process of manufacturing the lead frame having chip carrying areas and outer leads of different horizontal levels, decrease in yield due to weakened structure can be improved.

To summarize the foregoing descriptions, the lead frame having chip carrying areas of different horizontal levels according to the present invention can accommodate chips of different sizes while effectively maintaining the mold flow to be balanced during injection molding, thereby preventing the warpage of the package. Through down set stamping process, the lead frame can be arranged to have chip carrying areas of different horizontal levels. The present invention reduces the number of times the down set stamping process is performed, so as to obtain a better coplanarity control of the lead frame, and increase the yield and throughput.

While the invention is susceptible to various modifications and alternative forms, specific examples thereof have been shown in the drawings and have been described in detail. It should be understood, however, that the invention is not to be limited to the particular forms disclosed, but to the contrary, the invention is to cover all modifications, equivalents, and alternatives falling within the spirit and scope of the appended claims.

What is claimed is:

1. A lead frame package structure for side-by-side disposed chips comprising:
    a lead frame, wherein the lead frame comprises:
    a plurality of inner leads;
    a plurality of outer leads; and
    at least two chip carrying areas having different horizontal levels, wherein those chip carrying areas are connecting with each other and down set at different horizontal levels;
    at least two chips respectively disposed on the chip carrying areas, wherein the chips have different sizes and the thicker one of the chips is disposed on the chip carrying area down set at the lower level; and
    a package material encapsulating the inner leads, the chip carrying areas and the chips, wherein the outer leads exposed out of the package material are extended from the inner leads and have different horizontal levels.

2. The lead frame package structure for side-by-side disposed chips according to claim 1, wherein the chip carrying area is a die pad.

3. The lead frame package structure for side-by-side disposed chips according to claim 1, wherein the chip carrying area is constructed with the inner leads.

4. The lead frame package structure for side-by-side disposed chips according to claim 1, wherein one of the chip carrying areas is down set.

5. The lead frame package structure for side-by-side disposed chips according to claim 4, wherein the thicker one of the chips is disposed on the down set chip carrying area.

6. The lead frame package structure for side-by-side disposed chips according to claim 1, wherein the chip carrying areas are respectively down set at different horizontal levels.

7. The lead frame package structure for side-by-side disposed chips according to claim 6, wherein the thicker one of the chips is disposed on the chip carrying area down set at the lower level.

8. The lead frame package structure for side-by-side disposed chips according to claim 1, wherein the chips have different thicknesses.

* * * * *